United States Patent
Xie

(10) Patent No.: US 9,809,012 B2
(45) Date of Patent: Nov. 7, 2017

(54) FLEXIBLE DISPLAY DEVICE AND METHOD OF MANUFACTURING WINDOW MEMBER FOR THE SAME

(71) Applicant: SAMSUNG DISPLAY CO., LTD., Yongin-si, Gyeonggi-do (KR)

(72) Inventor: Lei Xie, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 36 days.

(21) Appl. No.: 14/956,276

(22) Filed: Dec. 1, 2015

(65) Prior Publication Data

US 2016/0271914 A1 Sep. 22, 2016

(30) Foreign Application Priority Data

Mar. 16, 2015 (KR) ........................ 10-2015-0036210

(51) Int. Cl.
*B32B 3/02* (2006.01)
*B32B 27/30* (2006.01)
(Continued)

(52) U.S. Cl.
CPC .............. *B32B 27/302* (2013.01); *B32B 3/16* (2013.01); *G06F 3/041* (2013.01); *G09F 9/301* (2013.01); *H01L 27/323* (2013.01); *H01L 51/0097* (2013.01); *B32B 1/00* (2013.01); *B32B 3/08* (2013.01); *B32B 3/18* (2013.01); *B32B 7/02* (2013.01); *B32B 7/12* (2013.01); *B32B 9/045* (2013.01); *B32B 15/08* (2013.01); *B32B 27/08* (2013.01); *B32B 27/26* (2013.01); *B32B 27/281* (2013.01); *B32B 27/285* (2013.01); *B32B 27/36* (2013.01); *B32B 2255/10* (2013.01); *B32B 2255/205* (2013.01); *B32B 2255/24* (2013.01);
(Continued)

(58) Field of Classification Search
CPC ......... B32B 27/08; B32B 27/302; B32B 7/12; B32B 3/16; B32B 5/142; B32B 2307/412; B32B 2307/536; B32B 2457/20
See application file for complete search history.

(56) References Cited

U.S. PATENT DOCUMENTS

2014/0065326 A1* 3/2014 Lee ........................... G06F 1/16
428/12
2014/0170391 A1 6/2014 Hongo et al.
(Continued)

FOREIGN PATENT DOCUMENTS

KR 10-2014-0066441 A 6/2014
KR 10-2014-0069513 A 6/2014
KR 10-1441428 B1 9/2014

OTHER PUBLICATIONS

European Patent Office Abstract for Korean Pub. No. KR 2009-0089086 A, dated Aug. 21, 2009, for KR 10-1441428 B1, 1 page.
(Continued)

*Primary Examiner* — Elizabeth Mulvaney
(74) *Attorney, Agent, or Firm* — Lewis Roca Rothgerber Christie LLP

(57) ABSTRACT

A flexible display device includes: a display panel to generate an image; and a window member on the display panel, the window member including: a base film; and a polymer layer including a first part and a plurality of second parts having lower hardness than that of the first part.

19 Claims, 12 Drawing Sheets

(51) Int. Cl.
  *H01L 51/00* (2006.01)
  *B32B 3/16* (2006.01)
  *G06F 3/041* (2006.01)
  *G09F 9/30* (2006.01)
  *H01L 27/32* (2006.01)
  *B32B 7/12* (2006.01)
  *B32B 7/02* (2006.01)
  *B32B 9/04* (2006.01)
  *B32B 15/08* (2006.01)
  *B32B 27/08* (2006.01)
  *B32B 27/26* (2006.01)
  *B32B 27/28* (2006.01)
  *B32B 27/36* (2006.01)
  *B32B 1/00* (2006.01)
  *B32B 3/08* (2006.01)
  *B32B 3/18* (2006.01)

(52) U.S. Cl.
  CPC ..... *B32B 2264/10* (2013.01); *B32B 2264/105* (2013.01); *B32B 2307/20* (2013.01); *B32B 2307/202* (2013.01); *B32B 2307/408* (2013.01); *B32B 2307/412* (2013.01); *B32B 2307/416* (2013.01); *B32B 2307/536* (2013.01); *B32B 2307/546* (2013.01); *B32B 2307/754* (2013.01); *B32B 2307/762* (2013.01); *B32B 2457/20* (2013.01); *B32B 2457/206* (2013.01); *B32B 2457/208* (2013.01); *H01L 2251/5338* (2013.01)

(56) References Cited

U.S. PATENT DOCUMENTS

2014/0287213 A1* 9/2014 Lee .................. G02F 1/133308
  428/217
2014/0315007 A1  10/2014 Oh et al.

OTHER PUBLICATIONS

Lee, Eal H. et al, "Hardness Enhancement and Crosslinking Mechanisms in Polystyrene Irradiated With High Energy Ion-Beams", Dec. 19, 1996, Oak Ridge National Laboratory, Oak Ridge, TN, USA, 19 pages.

* cited by examiner

FLEXIBLE DISPLAY DEVICE AND METHOD OF MANUFACTURING WINDOW MEMBER FOR THE SAME

CROSS-REFERENCE TO RELATED APPLICATION

This U.S. non-provisional patent application claims priority under 35 U.S.C. §119 of Korean Patent Application No. 10-2015-0036210, filed on Mar. 16, 2015, the entire contents of which are hereby incorporated by reference.

BACKGROUND

1. Field

One or more embodiments of the present disclosure herein relate to a flexible display device and a method of manufacturing a window member for the same.

2. Description of the Related Art

A variety of display devices used for multi-media devices, such as a television, a mobile phone, a tablet computer, a navigation device, a game machine, and the like, have been developed. A variety of forms of display devices have recently been developed. For example, a variety of flexible display devices have been developed, such as a curved display device, a banding type display device, a foldable display device, a rollable display device, a stretchable display device, and the like.

The above information disclosed in this Background section is only for enhancement of understanding of the background of the present disclosure, and therefore, it may contain information that does not form prior art.

SUMMARY

One or more embodiments of the present disclosure provide a flexible display device having improved flexibility and hardness.

One or more embodiments of the present disclosure provide a flexible display device that is less susceptible to an imprint defect.

One or more embodiments of the present disclosure provide a method of manufacturing a window member for a flexible display device.

Embodiments of the inventive concept provide flexible display devices including a display panel configured to generate an image, and a window member on the display panel, the window member including a base film, and a polymer layer comprising a first part and a plurality of second parts having lower hardness than that of the first part.

The polymer layer may include a cross-linkable polymer.

The cross-linkable polymer may include polystyrene.

The flexible display device may further include a touch panel between the display panel and the window member.

The flexible display device may further include a optically clear adhesive member bonding at least one of the display panel or the touch panel to the window member.

The base film may be on the optically clear adhesive member and the polymer layer is on the base film.

The window member may further include at least one of a self-healing layer, an anti-reflection layer, and an anti-finger layer on the base film.

The plurality of second parts may be spaced from each other on a plane parallel the display panel and surrounded by the first part.

The flexible display device may further include a foldable region, a first non-foldable region, and a second non-foldable region, the first and second non-foldable regions being adjacent the foldable region, and the plurality of second parts may be located on the foldable region.

The flexible display device may be configured to be rolled as a whole, and the plurality of second parts may be arranged at a uniform interval inside the first part.

Embodiments of the inventive concept provide methods of manufacturing a window member for a flexible display device, the method may include providing a base film, forming a cross-linkable polymer layer on the base film, and partially irradiating the cross-linkable polymer layer with a high energy ion-beam to form a polymer layer comprising a first part and a plurality of second parts having lower hardness than that of the first part.

The cross-linkable polymer layer may include polystyrene.

The method may further include forming at least one of an anti-finger layer, a self-healing layer, and an anti-reflection layer on the polymer layer.

The plurality of second parts may be spaced from each other on a plane parallel to the base film and surrounded by the first parts.

The plurality of second parts may be arranged at a uniform interval.

The cross-linkable polymer layer may include a foldable region, a first non-foldable region, and a second non-foldable region, the first and second non-foldable regions being adjacent the foldable region, and, in the irradiating of the cross-linkable polymer layer with a high energy ion-beam, some portion of the foldable region may be irradiated while other portions are not irradiated, and the first and second non-foldable regions may be irradiated with the high energy ion-beam.

The method may further include arranging a mask on the cross-linkable polymer layer before irradiating of the cross-linkable polymer layer with the high energy ion-beam, and the mask may include a first opening corresponding to a portion of the foldable region, and a second opening and a third opening corresponding to the first and second non-foldable regions, respectively.

BRIEF DESCRIPTION OF THE DRAWINGS

The above and other features and aspects of the present inventive concept will be more clearly understood from the following detailed description taken in conjunction with the accompanying drawings, in which.

DETAILED DESCRIPTION

Figure 1A:
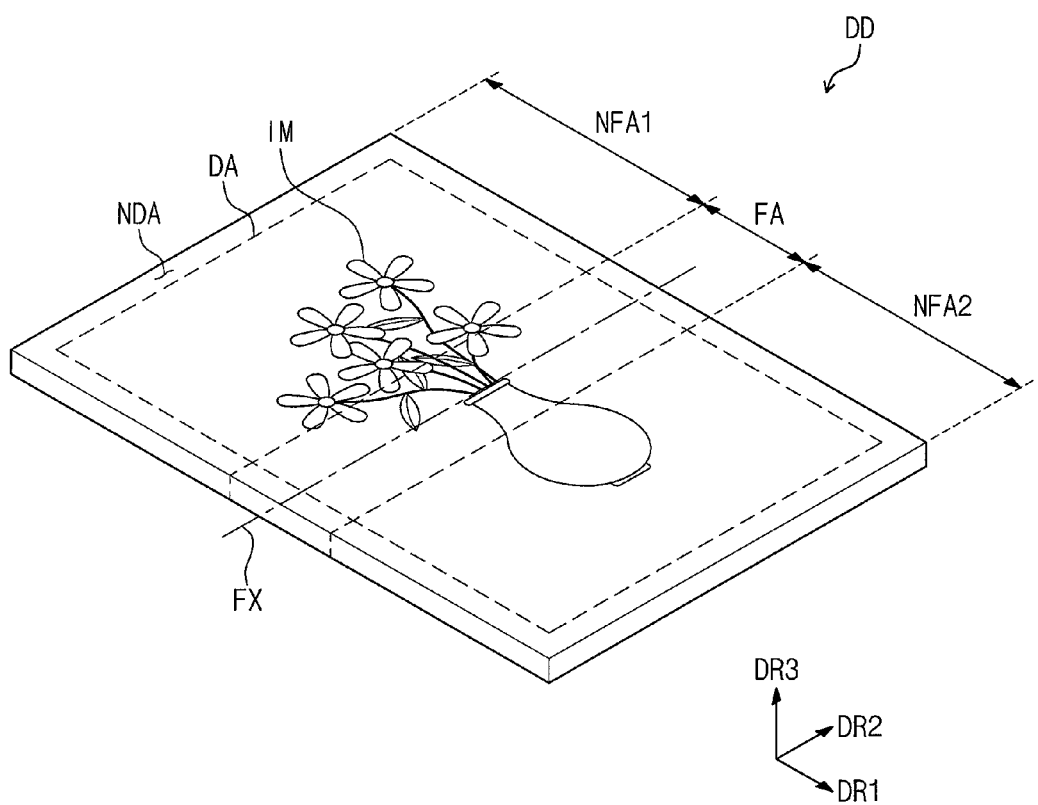
FIGS. 1A to 1B illustrate perspective views of a flexible display device according to an embodiment of the inventive concept.

Exemplary embodiments of the inventive concept will be described below in more detail with reference to the accompanying drawings. However, the inventive concept may be embodied in various different forms, and should not be construed as limited to the specific embodiments set forth herein. Rather, these embodiments are provided so that this disclosure will be thorough and complete, and will fully convey the scope of the inventive concept to those skilled in the art.

In the drawings, the dimensions of layers and regions are scaled up or down for clarity of illustration. Like reference numerals refer to like elements throughout the specification. It will also be understood that when a layer is referred to as being formed (or disposed) 'on' another layer, it may be directly on the other layer, or one or more intervening layers may also be present. In addition, although a surface of a layer is illustrated flat in the drawings, the surface may not be necessarily flat, and a step difference on a surface of an upper layer may be generated by a surface shape of a lower layer in a stacking process.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first", "second", and the like, may be used herein to describe various elements, components, areas, layers and/or sections, these elements, components, areas, layers and/or sections should not be limited by these terms. These terms are only used to distinguish one element, component, area, layer or section from another element, component, area, layer or section. Thus, a first element, component, area, layer, or section that is discussed below could be termed a second element, component, area, layer, or section without departing from the spirit and scope of the present invention.

It will be understood that when an element or layer is referred to as being "connected to" or "coupled to" another element or layer, it can be directly connected to or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are also intended to include the plural forms, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation, and are not used as terms of degree, and are intended to account for inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a flexible display device according to example embodiments of the inventive concept will be described with reference to the accompanying drawings.

Figure 1B:
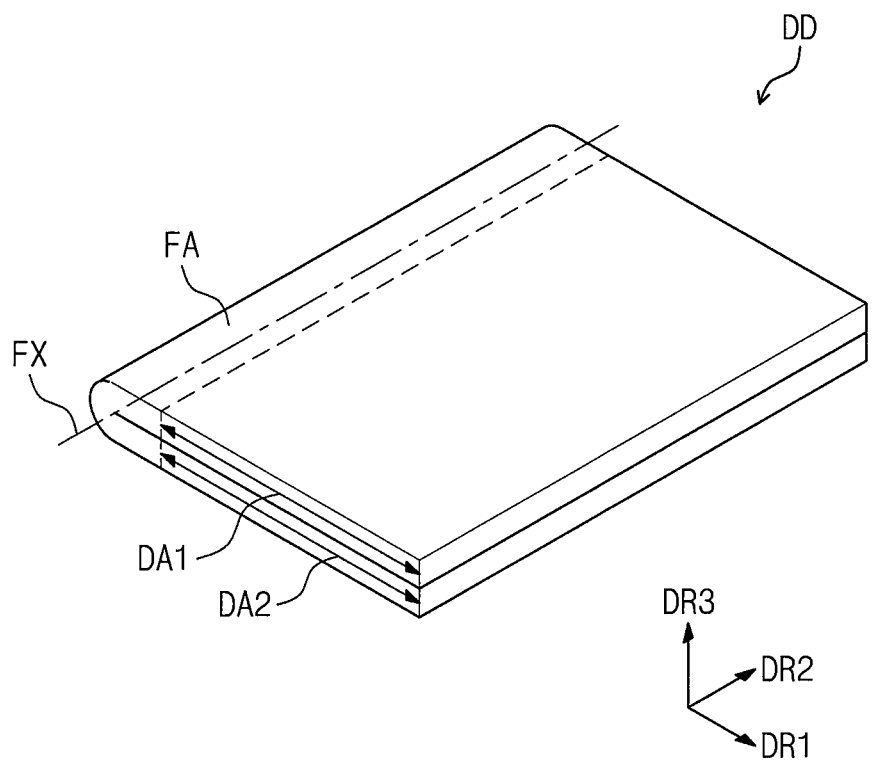

FIGS. 1A to 1B illustrate perspective views of a flexible display device DD according to an embodiment of the inventive concept. In the present embodiment, a foldable display device is exemplarily illustrated as an example of a flexible display device DD (hereinafter, a display device DD). However, in other embodiments, the inventive concept may be applied to a variety of display devices DD, such as a curved display device, a banding type display device, a foldable display device, a rollable display device, and/or a stretchable display device. Although not shown separately, a display device DD according to the inventive concept may be used for small and medium-sized electronic devices, such as a mobile phone, a personal computer, a notebook computer, a personal digital assistant, a car navigation unit, a game machine, a portable electronic device, a wrist watch type electronic device, and/or a camera, as well as large electronic devices, such as a television and/or an external billboard.

As illustrated in FIGS. 1A and 1B, a display surface for displaying an image IM is parallel to a surface defined by (e.g., extending in) a first directional axis DR1 and a second directional axis DR2. A third directional axis DR3 indicates a normal direction that is normal to the display surface. The third directional axis DR3 also indicates a thickness direction of the flexible display device DD. A front surface and a rear surface of each member correspond to the third directional axis DR3. However, the directions indicated by the directional axes DR1, DR2, and DR3 are examples only, and thus, may each include other directions.

As illustrated in FIG. 1, the display device DD includes a plurality of regions divided on the display surface. The display device DD may be divided into a display region, or display area, DA and a non-display region, or non-display area, NDA according to whether an image IM is displayed in the area. The display region DA is a region for displaying an image IM, and the non-display region NDA is a region that is adjacent to the display region DA and does not display an image. FIG. 1 illustrates an image IM of a vase as an example of the image IM. As an example, the display region DA may have a rectangular shape. The non-display region NDA may surround (e.g., may be located at a periphery of) the display region DA. The display device DD may be divided according to operation of a foldable region, or foldable area, FA that may be folded along a folding axis FX, and a first non-foldable region NFA1 and a second non-foldable region NFA2, which may not be foldable.

Figure 2A:
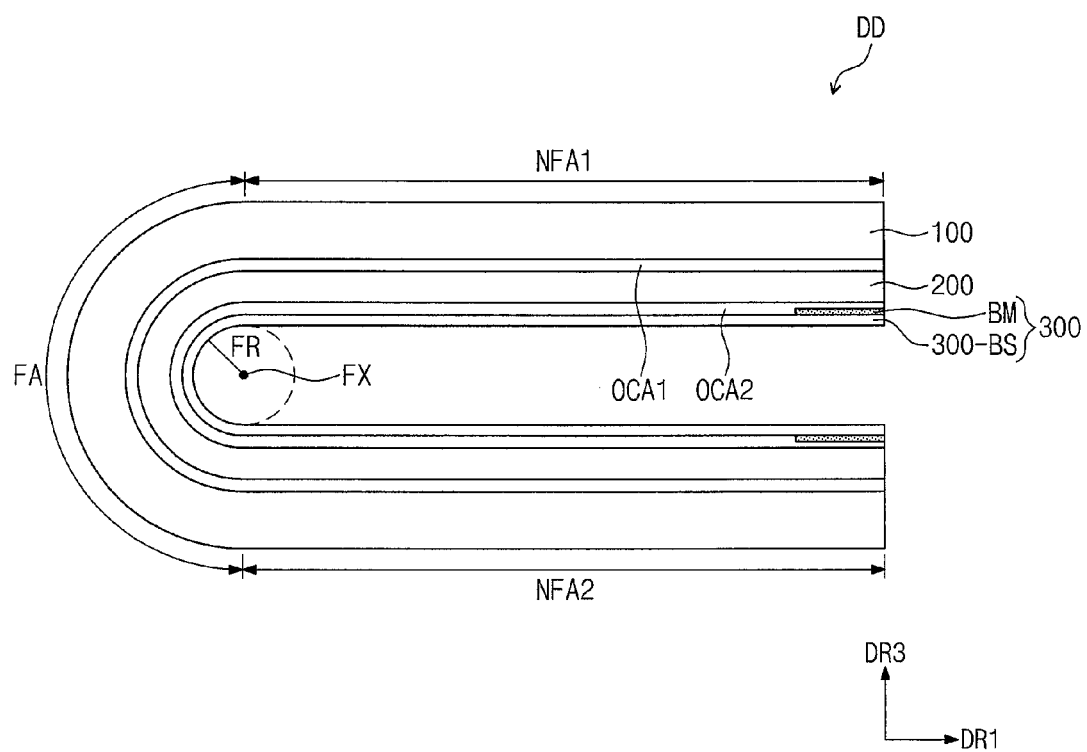
FIGS. 2A to 2B illustrate enlarged cross-sectional views of a flexible display device according to an embodiment of the inventive concept.
Figure 2B:
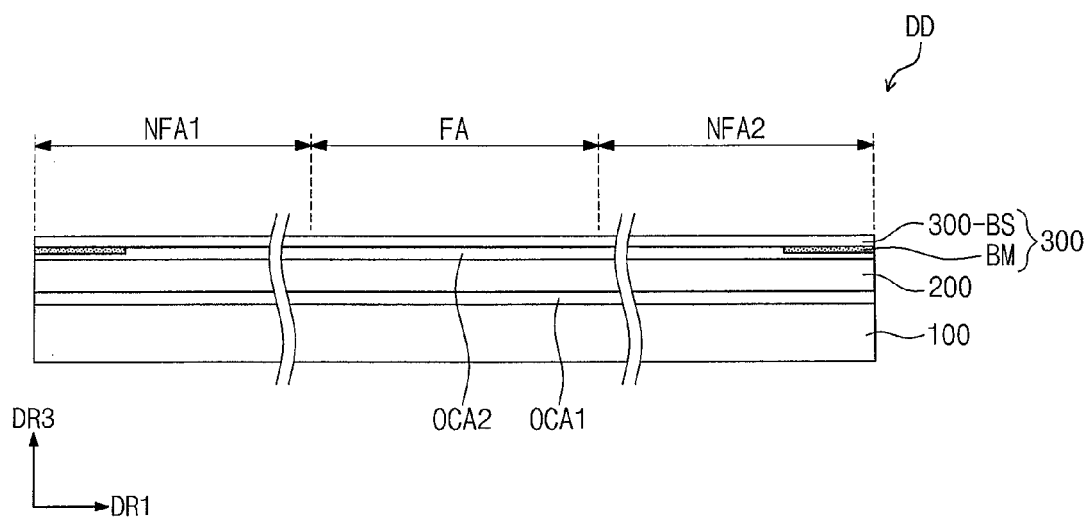

FIGS. 2A to 2B illustrate enlarged cross-sectional views of a display device DD according to an embodiment of the inventive concept. As illustrated in FIG. 2A, the display device DD may be folded along the folding axis FX, so that display surfaces of the first and second non-foldable regions NFA1 and NFA2 face each other. Hereinafter, the term "inner folding," or "inward folding," refers to a configuration in which the display surfaces of different regions are folded so as to face each other. In one embodiment, since the first non-foldable region NFA1 is configured to be rotated in a clockwise direction along the folding axis FX, the foldable display device may be inner folding. However, the inventive concept is not limited thereto, and the display device DD may be folded along the folding axis FX so that the display surfaces of the first and second non-foldable regions NFA1 and NFA2 face towards an outside. Hereinafter, the term "outer folding," or "outward folding," refers to a configuration in which the display surfaces of different regions are folded so as to be oriented towards an outside.

As illustrated in FIGS. 2A and 2B, the display device DD includes a display panel 100, a touch panel 200, and a window member 300. In one embodiment, the display device DD may further include a protective member bonded to the window member 300 to protect the display panel 100 and the touch panel 200. Each of the display panel 100, the touch panel 200, and the window member 300 may be flexible. In other embodiments, the touch panel 200 may be omitted.

The display panel 100 is configured to generate an image IM (see FIG. 1A) corresponding to input image data. The display panel 100 may be a liquid crystal display panel, an organic light emitting display panel, an electrophoretic display panel, an electrowetting display panel, or the like, although a type of the display panel 100 is not limited thereto. In an embodiment of the inventive concept, an organic light emitting display panel is described as an example.

An organic light emitting display panel 100 may include a base member, a circuit layer, an element layer, and an encapsulation layer. In one embodiment, the organic light emitting display panel 100 may further include an optical member located on the encapsulation layer, for example, a phase delay plate and/or a polarizer.

The base member may include at least one plastic film. The base member may further include inorganic films such as, for example, a silicon nitride film and/or a silicon oxide film. The circuit layer includes a plurality of signal lines provided in the organic light emitting display panel 100 such as, for example, gate lines and data lines, and may also include other electronic elements. The plurality of signal lines and the electronic elements may be insulated by insulating layers.

The element layer includes an organic light emitting diode, and may further include electronic elements for assisting the organic light emitting diode. The encapsulation layer seals the element layer, and may include thin film encapsulation layers TFE that may include a plurality of inorganic thin films and a plurality of organic thin films.

The touch panel 200 obtains coordinate information of an input point. The touch panel 200 may be located on a front surface of the display panel 100, although a positional relationship between the display panel 100 and the touch panel 200 is not limited thereto. The touch panel 200 may be a contact type or a non-contact type touch panel. The touch panel 200 may be a resistance film type, an electromagnetic induction type, and/or an electrostatic capacitance type touch panel, although the type of the touch panel 200 is not limited thereto.

The touch panel 200 may include the base member and at least one conductive layer located on the base member. The conductive layer may include a transparent conductive oxide such as, for example, indium tin oxide (ITO), indium zinc oxide (IZO), zinc oxide (ZnO), and/or indium tin zinc oxide (ITZO). The conductive layer may include metals, such as molybdenum, silver, titanium, copper, aluminum and/or an alloy thereof. The conductive layer may include PEDOT, a metal nano-wire, and/or a graphene. The conductive layer may include a first layer including any one of the aforementioned materials, a second layer including another material, and other layers. The conductive layer may include a plurality of conductive patterns disposed on one surface of the base member. The plurality of conductive patterns may include touch sensors and signal lines of the touch panel 200.

The window member 300 may include a cover member 300-BS and a black matrix BM. The black matrix BM may be disposed on a rear surface of the cover member 300-BS to define a bezel region, e.g., the non-display region NDA (see FIG. 1A) of the display device DD. The black matrix BM may include a colored organic layer, and may be formed by, for example, a coating process. In other embodiments, the black matrix BM may be omitted. The cover member 300-BS will be described in more detail below.

The display panel 100 and the touch panel 200 may be bonded by an optically clear (e.g., transparent or substantially transparent) adhesive member OCA1. The touch panel 200 and the window member 300 may also be bonded by an optically clear adhesive member OCA2. A base film BF (see FIG. 3) of the window member 300 may also be bonded to an optically clear adhesive member.

In other embodiments, any one of the two optically clear adhesive members OCA1 and OCA2 may be omitted. For example, when the display panel 100 and the touch panel 200 are manufactured in a continuous process, the conductive layer of the touch panel 200 may be located (e.g., directly disposed) on the display panel 100. In addition, for example, when the touch panel 200 and the window member 300 are manufactured in a continuous process, the window member 300 may be located (e.g., directly disposed) on the touch panel 200.

Figure 3:
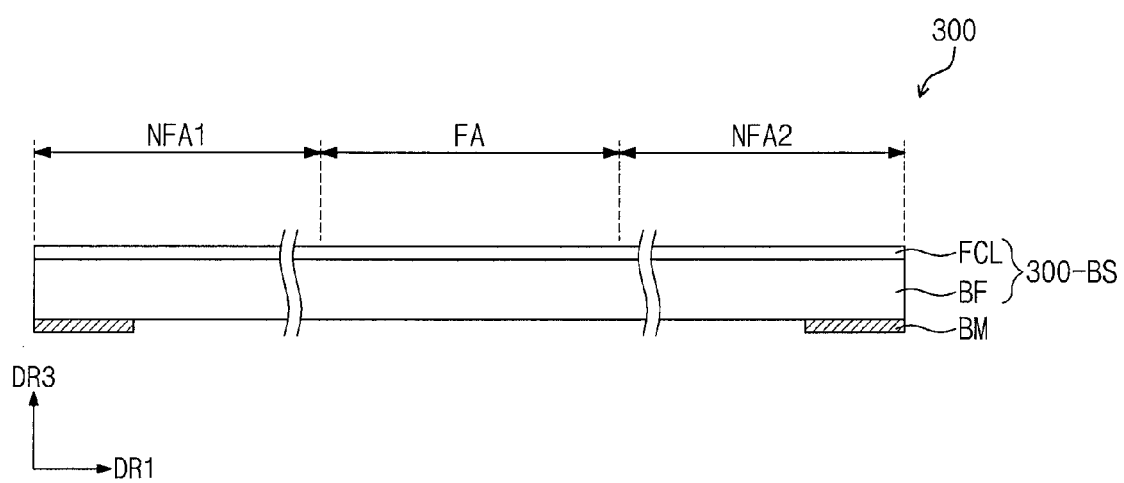
FIG. 3 illustrates a cross-sectional view of a window member according to an embodiment of the inventive concept.
Figure 4A:
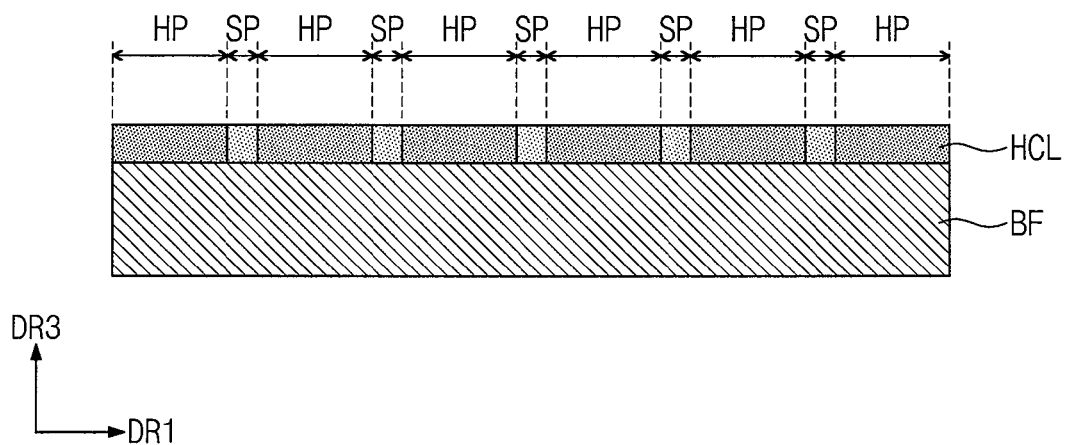
FIG. 4A illustrates an enlarged cross-sectional view of a first region of a window member according to an embodiment of the inventive concept.
Figure 4B:
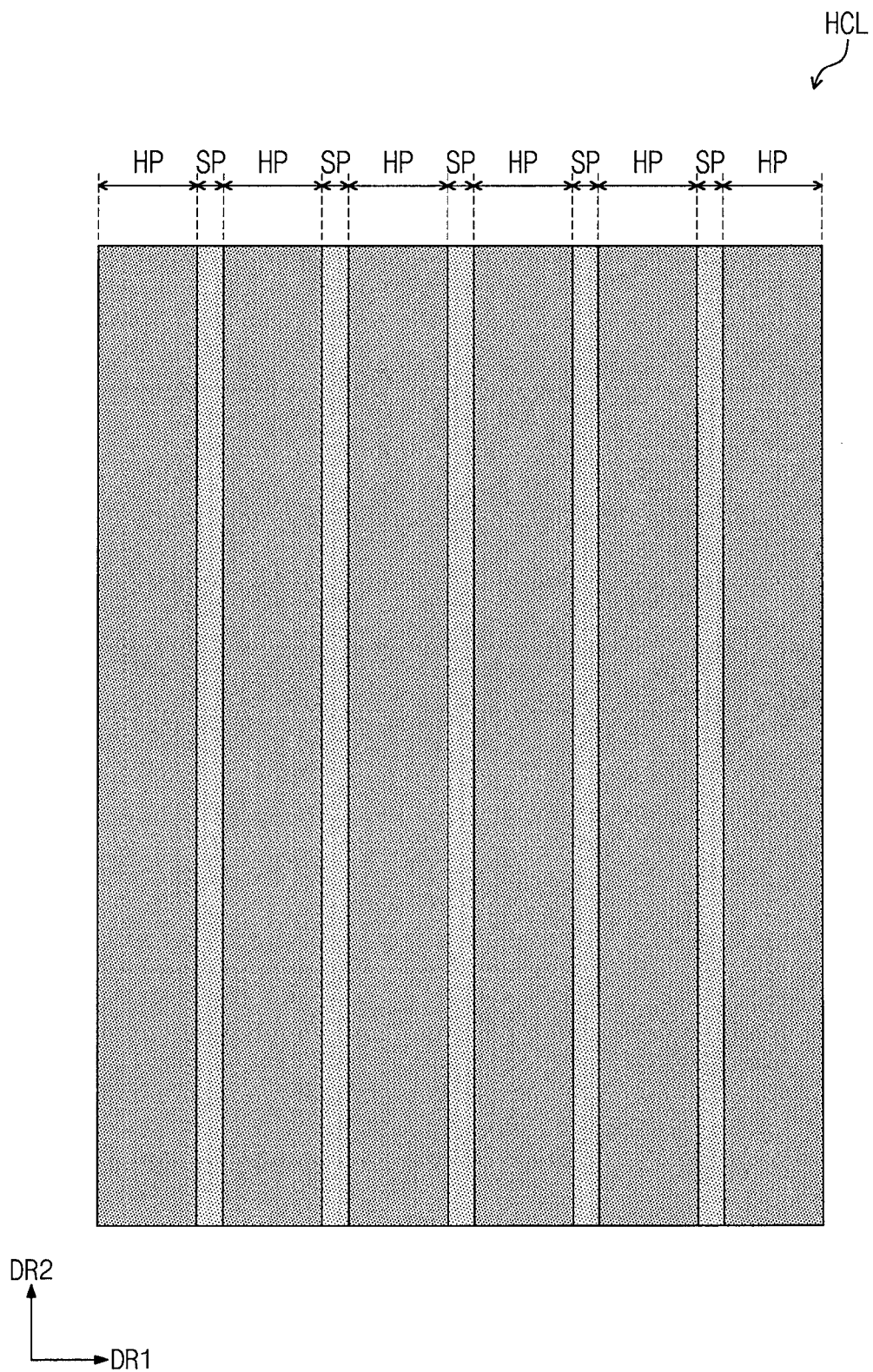
FIG. 4B illustrates an enlarged plan view of a first region of the window member according to an embodiment of the inventive concept.
Figure 4C:
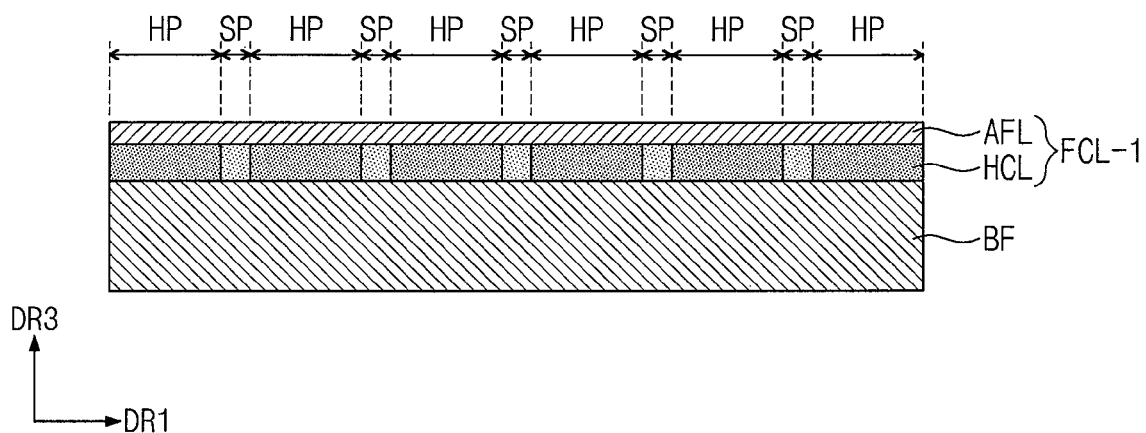
FIG. 4C illustrates an enlarged cross-sectional view of a first region of a window member according to an embodiment of the inventive concept.
Figure 4D:
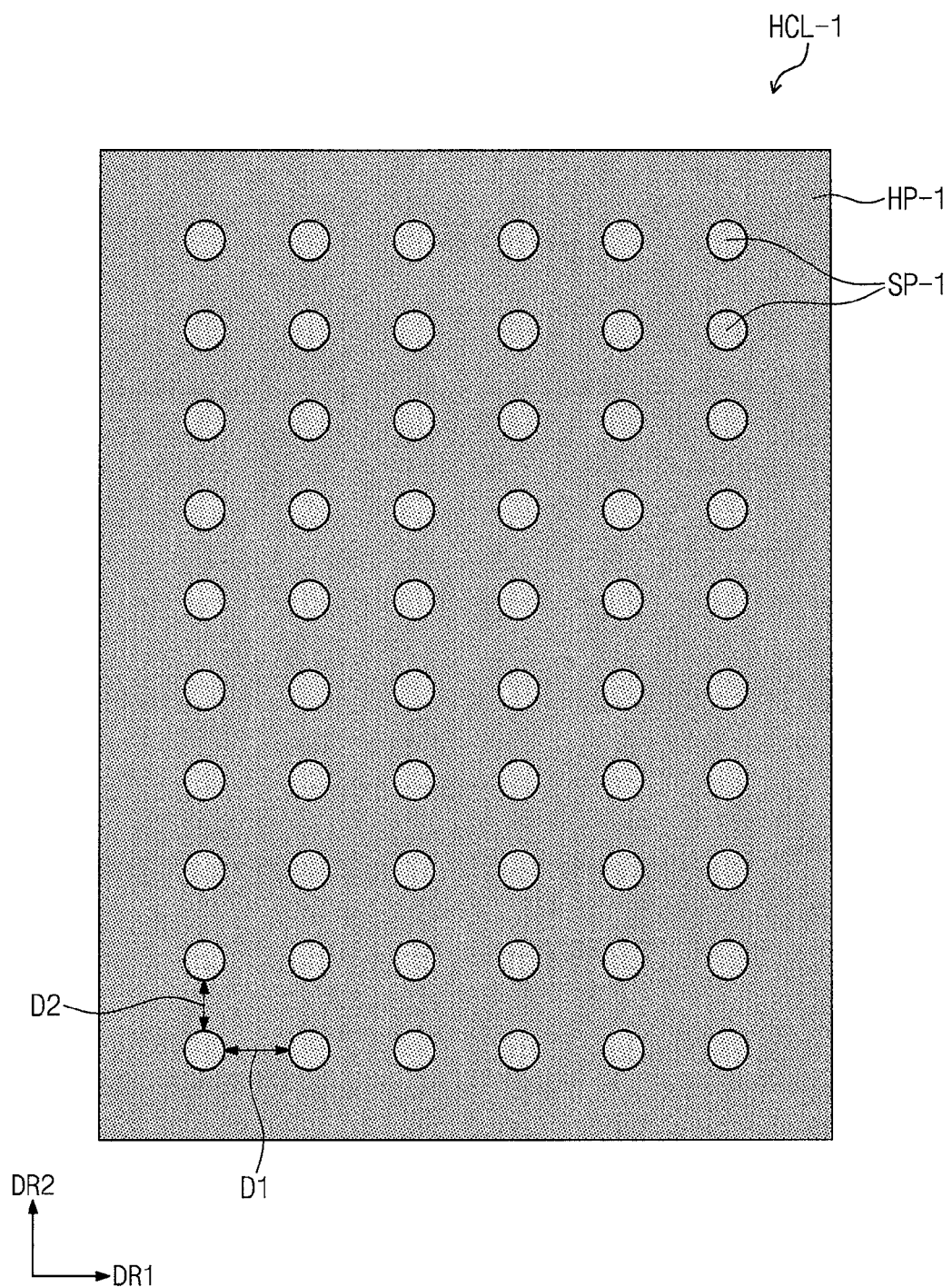
FIG. 4D illustrates an enlarged plan view of a first region of the window member according to an embodiment of the inventive concept.

FIG. 3 illustrates a cross-sectional view of a window member 300 according to an embodiment of the inventive concept. FIG. 4A illustrates an enlarged cross-sectional view of a first region of the window member 300 according to an embodiment of the inventive concept. FIG. 4B illustrates an enlarged plan view of a first region of the window member 300 according to an embodiment of the inventive concept. FIG. 4C illustrates an enlarged cross-sectional view of a first region of the window member 300 according to an embodiment of the inventive concept. FIG. 4D illustrates an enlarged plan view of a first region of the window member 300 according to an embodiment of the inventive concept.

As illustrated in FIG. 3, the window member 300 includes the cover member 300-BS and the black matrix BM. The cover member 300-BS includes a base film BF, and a functional layer FCL located on the base film BF.

The base film BF is a flexible plastic film, and may include, for example, at least one from among polyimide (PI), polyethyleneterephthalate (PET), polyethylenenaphthalate (PEN), and polyethersulphone (PES). The functional layer FCL may include a hard coating layer, a self-healing layer, an anti-reflection layer, an anti-finger layer, and/or the like.

FIGS. 4A and 4B exemplarily illustrate the cover member 300-BS including only a hard coating layer HCL as the functional layer FCL, although the inventive concept is not limited thereto. FIGS. 4A and 4B illustrate a partial region of the cover member 300-BS corresponding to the foldable region FA (see FIG. 3).

The hard coating layer HCL may include a polymer layer including at least one first part HP and at least one second part SP. FIGS. 4A and 4B exemplarily illustrate the hard coating layer HCL including the polymer layer of a single layer. In addition, FIGS. 4A and 4B exemplarily illustrate the hard coating layer HCL including six of the first parts HP and five of the second parts SP. In other embodiments, the hard coating layer HCL corresponding to the first and second non-foldable regions NFA1 and NFA2 (see FIG. 3) may include only the first part HP, or may include a first part HP having a larger (e.g., much larger) surface area than that of the second parts SP.

In one embodiment, each of the second parts SP may have lower hardness than that of the first parts HP. The plurality of second parts SP may have the same or substantially the same hardness with each other.

The polymer layer includes a cross-linkable polymer. The polymer layer may include an acrylate based polymer and/or an epoxy based polymer. For example, the polymer layer may include polystyrene. Since the first parts HP, when irradiated with a high energy ion-beam, are chemically bonded, e.g., cross-linked between polymer chains, the first parts HP have a greater hardness than the second parts SP, which are not irradiated. The first parts HP have a greater crosslink number density than the second parts SP. A detailed description thereof will be described below with reference to a manufacturing method of the window member 300.

For example, the first parts HP have a few times to several tens of times greater hardness than the second parts SP. In addition, the first parts HP have a few times to several tens of times greater hardness than the base film BF. The first parts HP may enhance the hardness of the window member 300. Since the polymer layer has a high overall surface hardness, it is possible to prevent or reduce an imprint defect of the window member 300 caused by an external object.

As illustrated in FIGS. 4A and 4B, the first and second parts HP and SP may have a stripe shape extending along the second directional axis DR2. The first and second parts HP and SP may be alternatingly arranged along the first directional axis DR1 inside the foldable region FA.

The second parts SP on the foldable region FA have relatively low hardness, and are therefore able to be easily folded. Accordingly, whether inner folded or outer folded, the window member 300 does not break, e.g., no crack occurs.

FIG. 4C exemplarily illustrates a functional layer FCL-1 further including an "anti-finger layer" AFL on the hard coating layer HCL. In one embodiment of the inventive concept, the functional layer FCL-1 may further include at least one of an anti-finger layer AFL, a self-healing layer, and an anti-reflection layer. Since materials included in the anti-finger layer AFL, the self-healing layer, and the anti-reflection layer are known in the art, a detailed description thereof will not be described.

FIG. 4D exemplarily illustrates a hard coating layer HCL-1 having a different shape from that of the hard coating layer HCL in FIG. 4B. Second parts SP-1 may be spaced apart from each other on a plane parallel to the first and second directions DR1 and DR2, and may be surrounded by the first part(s) HP-1.

As illustrated in FIG. 4D, the second parts SP-1 may be arranged at uniform or substantially uniform intervals D1 and D2. The first intervals D1 extending along the first directional axis DR1 may be the same or substantially the same length, and the second intervals D2 extending along the second directional axis DR2 may be the same or substantially the same length.

FIG. 4D exemplarily illustrates the second parts SP-1 having the same, or substantially the same, circular shape. In one embodiment, the second parts SP-1 may have the same/substantially the same polygonal shape, and in some embodiments, some of the second parts SP-1 may have a different shape from the shapes of others of the second parts SP-1.

Figure 5A:
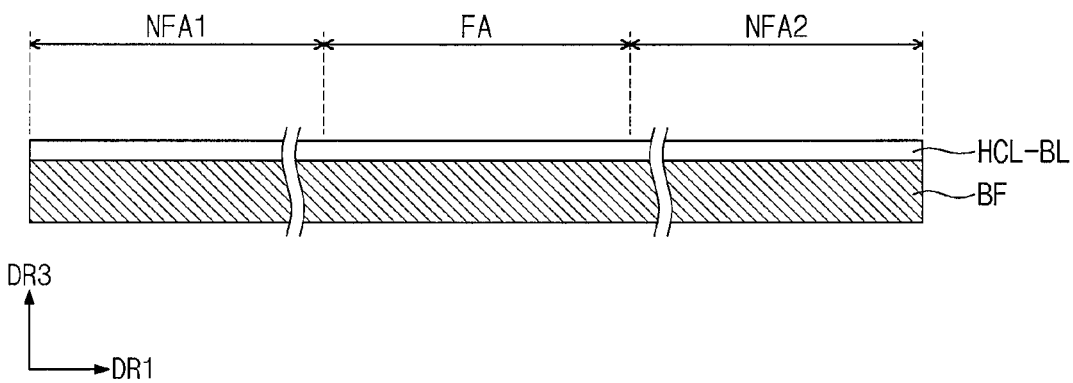
FIGS. 5A to 5C illustrate cross-sectional views of a method of manufacturing a window member according to an embodiment of the inventive concept.
Figure 5B:
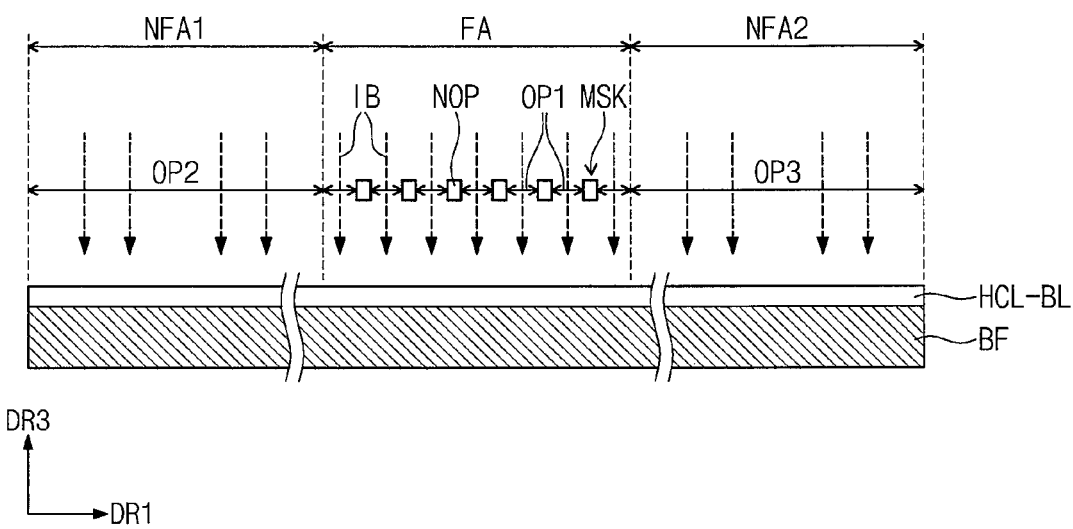
Figure 5C:
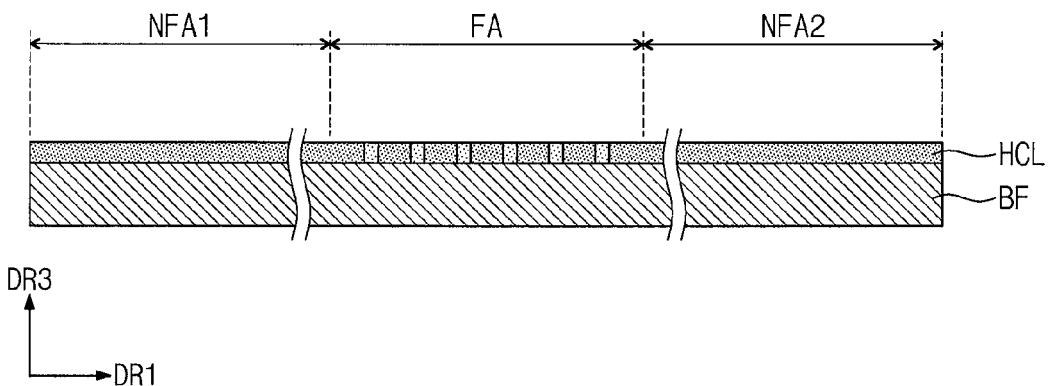

FIGS. 5A to 5C illustrate cross-sectional views of a method of manufacturing a window member 300 according to an embodiment of the inventive concept. A detailed description of the components that are the same or substantially the same as those described with reference to FIGS. 1 to 4D might not be repeated.

As illustrated in FIG. 5A, a base film BF is provided. A cross-linkable polymer layer HCL-BL is formed on one surface of the base film BF. The cross-linkable polymer layer HCL-BL may be formed by a spin coating, a slot coating, a gravure coating, and/or the like. A liquid material used for the cross-linkable polymer layer HCL-BL may be coated and then cured.

As illustrated in FIG. 5B, the cross-linkable polymer layer HCL-BL is partially irradiated with a high energy ion-beam IB. For example, the cross-linkable polymer layer HCL-BL may be partially irradiated with 350 KeV He+ ions and 1 MeV Ar+ ions by using a triple ion-beam irradiation facility.

Some of the foldable region FA are irradiated with the high energy ion-beam IB, and some of other regions are not irradiated. In a portion of the cross-linkable polymer layer irradiated with the high energy ion-beam IB, a terminal element, such as a hydrogen, is scissioned, thereby generating a reactive group. A reactive group, such as a radical or dangling bond, is generated by a pendant atom such as a hydrogen atom. The reactive group is cross linked by a union of two free dangling bonds between neighboring chains and a formation of neighboring radicals of one chain.

The first and second non-foldable regions NFA1 and NFA2 may be irradiated as a whole. Only some regions may be irradiated with a high energy ion-beam IB by using a mask MSK. The mask MSK may include a first opening OP1 and a non-opening NOP corresponding to the foldable region FA, and a second opening OP2 and a third opening OP3 corresponding to the first and second non-foldable regions NFA1 and NFA2, respectively. The first opening OP1 may have a substantially same shape as that of the first part HP illustrated in FIG. 4B or that of the first part HP-1 illustrated in FIG. 4D. The non-opening NOP may have a substantially same shape as that of the second part SP illustrated in FIG. 4B or that of the second part SP-1 illustrated in FIG. 4D.

As illustrated in FIG. 5C, the polymer layer HCL having different hardness according to a region is formed. As described with reference to FIGS. 4A and 4B, the polymer layer HCL including the first parts HP and the second parts SP having lower hardness than that of the first parts HP is formed. The polymer layer HCL corresponds to the hard coating layer.

In some embodiments, at least any one of the anti-finger layer, the self-healing layer, and the anti-reflection layer may be formed on the polymer layer HCL. The layers may be formed by a spin coating, a slot coating, a gravure coating, and/or the like. When the window member 300 is manufactured, the window member 300 may be bonded to the display panel 100 (see FIG. 2) or the touch panel 200 (see FIG. 2) by using an optically clear (e.g., transparent or substantially transparent) adhesive member.

Figure 6:
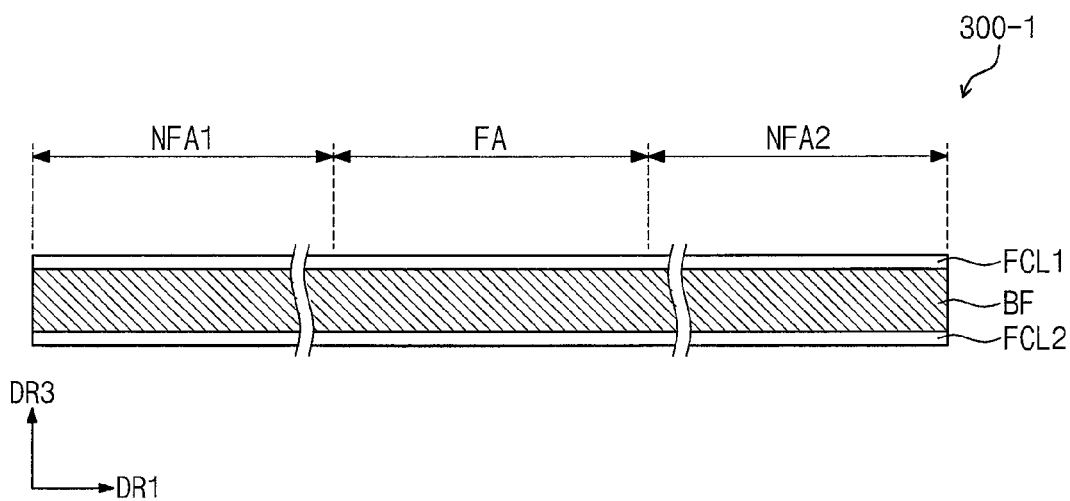
FIG. 6 illustrates a cross-sectional view of a window member according to an embodiment of the inventive concept.

FIG. 6 illustrates a cross-sectional view of a window member 300-1 according to an embodiment of the inventive concept. A detailed description of the components that are the same or substantially the same as those described with reference to FIGS. 1 to 5C may not be repeated.

A window member 300-1 may include a base film BF, a first functional layer FCL1 on a front surface of the base film BF, and a second functional layer FCL2 on a rear surface of the base film BF. Each of the first and second functional layers FCL1 and FCL2 may include at least one from among a hard coating layer, a self-healing layer, an anti-reflection layer, and an anti-finger layer.

In one embodiment, the first functional layer FCL1 may include at least any one of the hard coat layer, the self-healing layer, the anti-reflection layer, and the anti-finger layer, and the second functional layer FCL2 may include at least any one of the hard coat layer and the anti-reflection layer.

Figure 7:
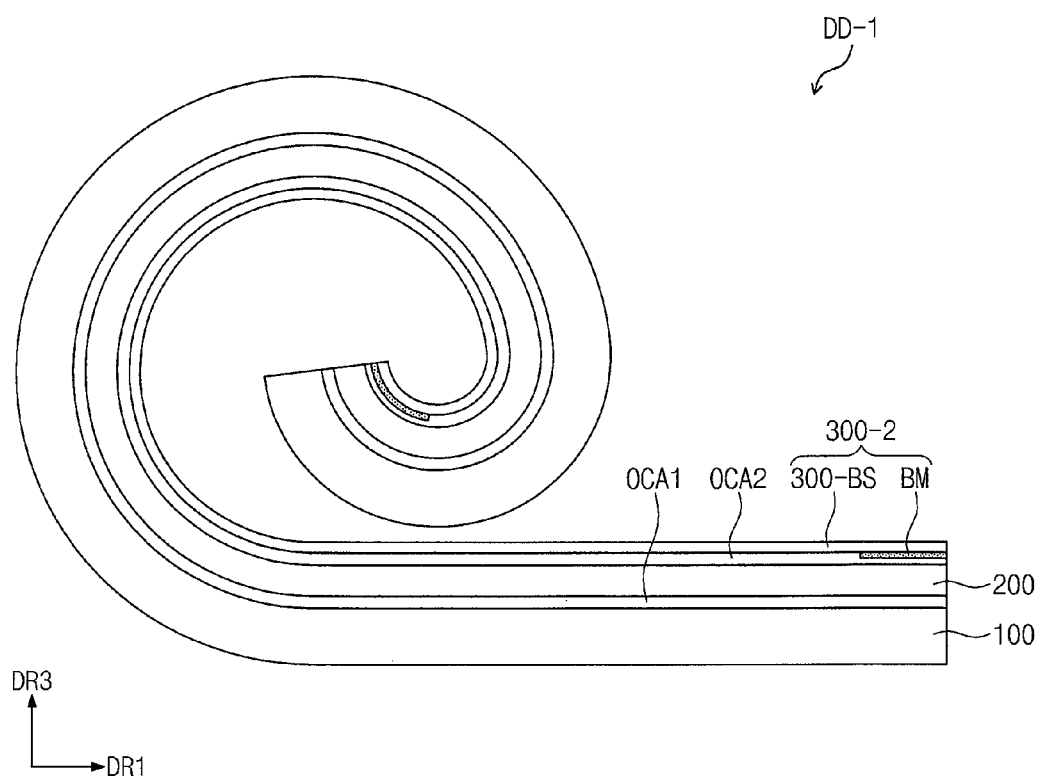
FIG. 7 illustrates an enlarged cross-sectional view of a flexible display device according to an embodiment of the inventive concept.

FIG. 7 illustrates an enlarged cross-sectional view of a flexible display device DD-1 according to an embodiment of the inventive concept. A detailed description of the components that are the same or substantially the same as those described with reference to FIGS. 1 to 6 may not be repeated.

A flexible display device DD-1 may be rolled as a whole. The flexible display device DD-1 may include a display panel 100, a touch panel 200, and a window member 300-2.

The window member 300-2 may include a cover member 300-BS and a black matrix BM. The cover member 300-BS may include a base film BF and a functional layer FCL on the base film BF. The functional layer FCL may include at least a hard coating layer HCL.

The hard coating layer HCL may have a shape as a whole illustrated in FIG. 4B or 4D regardless of a region. An imprint defect of the window member 300 may be reduced by the first parts HP and HP-1, and even when the flexible display device DD-1 is rolled, the window member 300-2 may not be easily broken due to an influence of the second parts SP and SP-1.

As described above, since the polymer layer of the window member has high surface hardness as a whole, it may be possible to prevent or reduce an imprint defect caused by an external object. The polymer layer includes the second parts having relatively low hardness, thus being able to be not broken even when folded.

While the inventive concept has been particularly shown and described with reference to exemplary embodiments thereof, it will be understood by those of ordinary skill in the art that various changes in form and details may be made therein without departing from the spirit and scope of the inventive concept.

Hence, the spirit and scope of the inventive concept shall be determined not by the detailed description of the example embodiments, but by the spirit and scope of the accompanying claims, and their equivalents.

What is claimed is:
1. A flexible display device comprising:
a display panel configured to generate an image; and
a window member on the display panel, the window member comprising:
a base film; and
a polymer layer comprising a first part and a plurality of second parts having lower hardness than the first part,
wherein a width of each of the second parts is smaller than a width of the first part at a bending area.
2. The flexible display device of claim 1, wherein the polymer layer comprises a cross-linkable polymer.
3. A flexible display device comprising:
a display panel configured to generate an image; and
a window member on the display panel, the window member comprising:
a base film; and
a polymer layer comprising a first part and a plurality of second parts having lower hardness than the first part,
wherein the polymer layer comprises a cross-linkable polymer, and
wherein the cross-linkable polymer comprises polystyrene.
4. The flexible display device of claim 1, further comprising a touch panel between the display panel and the window member.
5. The flexible display device of claim 4, further comprising a optically clear adhesive member bonding at least one of the display panel or the touch panel to the window member.
6. The flexible display device of claim 5, wherein the base film is on the optically clear adhesive member and the polymer layer is on the base film.
7. The flexible display device of claim 6, wherein the window member further comprises at least one of a self-healing layer, an anti-reflection layer, and an anti-finger layer on the base film.
8. The flexible display device of claim 1, wherein the plurality of second parts are spaced from each other on a plane parallel the display panel and surrounded by the first part.
9. The flexible display device of claim 8, wherein the flexible display device comprises a foldable region, and a first non-foldable region and a second non-foldable region which are adjacent to the foldable region, and wherein the plurality of second parts are disposed on the foldable region.

10. The flexible display device of claim 8, wherein the flexible display device is configured to be rolled as a whole, and
wherein the plurality of second parts are arranged at a uniform interval inside the first part.

11. A method of manufacturing a window member for a flexible display device, the method comprising:
providing a base film;
forming a cross-linkable polymer layer on the base film; and
partially irradiating the cross-linkable polymer layer with a high energy ion-beam to form a polymer layer comprising a first part and a plurality of second parts having lower hardness than the first part,
wherein a width of each of the second parts is smaller than a width of the first part at a bending area.

12. The method of claim 11, wherein the cross-linkable polymer layer comprises polystyrene.

13. The method of claim 11, further comprising forming at least one of an anti-finger layer, a self-healing layer, and an anti-reflection layer on the polymer layer.

14. The method of claim 11, wherein the plurality of second parts are spaced from each other on a plane parallel to the base film and surrounded by the first parts.

15. The method of claim 14, wherein the plurality of second parts are arranged at a uniform interval.

16. The method of claim 11; wherein the cross-linkable polymer layer comprises a foldable region, a first non-foldable region, and a second non-foldable region, the first and second non-foldable regions being adjacent the foldable region, and
wherein, in the irradiating of the cross-linkable polymer layer with a high energy ion-beam, some portion of the foldable region is irradiated while other portions are not irradiated, and the first and second non-foldable regions are irradiated with the high energy ion-beam.

17. The method of claim 16, further comprising arranging a mask on the cross-linkable polymer layer before irradiating of the cross-linkable polymer layer with the high energy ion-beam, wherein the mask comprises a first opening corresponding to a portion of the foldable region, and a second opening and a third opening corresponding to the first and second non-foldable regions, respectively.

18. The flexible display device of claim 1, wherein the first part has a larger surface area than that of the plurality of second parts.

19. The flexible display device of claim 1, wherein the first part has a greater crosslink number density than that of the plurality of second parts.

* * * * *